(12) United States Patent
Schlösser et al.

(10) Patent No.: US 6,638,812 B2
(45) Date of Patent: Oct. 28, 2003

(54) METHOD FOR PRODUCING A MEMORY CELL FOR A SEMICONDUCTOR MEMORY

(75) Inventors: Till Schlösser, Dresden (DE); Franz Hofmann, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/096,459

(22) Filed: Mar. 12, 2002

(65) Prior Publication Data

US 2002/0127803 A1 Sep. 12, 2002

(30) Foreign Application Priority Data

Mar. 12, 2001 (DE) .......................... 101 11 760

(51) Int. Cl.$^7$ .......................... H01L 21/8242
(52) U.S. Cl. .......................... 438/243
(58) Field of Search .......................... 438/206, 212, 438/242, 268, 258, 243, 246

(56) References Cited

U.S. PATENT DOCUMENTS 5,208,657 A 5/1993 Chatterjee et al.
5,744,386 A 4/1998 Kenney
6,316,309 B1 * 11/2001 Holmes et al. ............. 438/246
6,518,613 B2 * 2/2003 Willer et al. ................ 257/296

FOREIGN PATENT DOCUMENTS

DE 198 45 058 A1 4/2000
DE 199 23 262 C1 6/2000

* cited by examiner

*Primary Examiner*—David Nelms
*Assistant Examiner*—Thao P Le
(74) *Attorney, Agent, or Firm*—Laurence A. Greenberg; Werner H. Stemer; Ralph E. Locher

(57) ABSTRACT

The method of the invention, in contrast to conventional trench capacitors wherein the memory node is formed in a trench, normally in the form of a drilled hole, includes the steps of forming the memory node in the monocrystalline silicon of the substrate and remains as a web during an etching process while a trench is filled with the common opposing electrode of the memory cell array. In the method, it is advantageous for the selection transistor to be in the form of a vertical transistor above the memory node in the freestanding web.

11 Claims, 5 Drawing Sheets

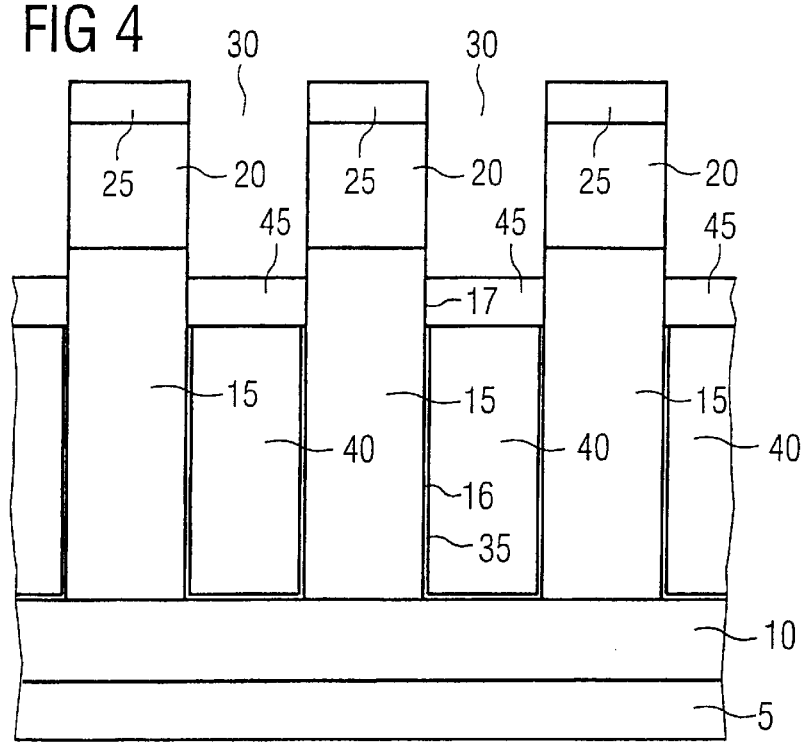
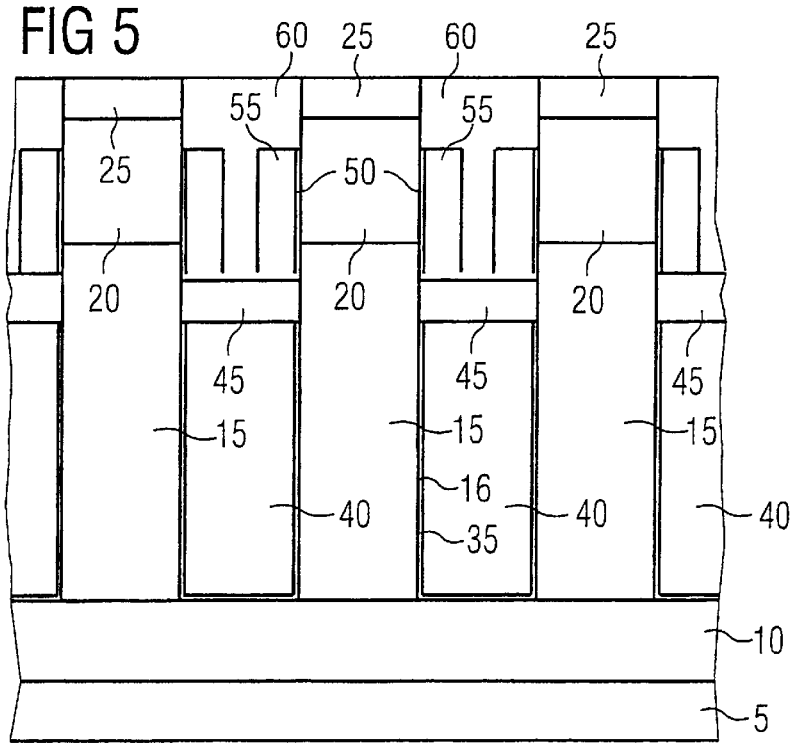

METHOD FOR PRODUCING A MEMORY CELL FOR A SEMICONDUCTOR MEMORY

BACKGROUND OF THE INVENTION

Field of the Invention

The invention lies in the field of integrated circuits. The invention relates to a method for producing a memory cell for a semiconductor memory.

Semiconductor memories, such as DRAMs (Dynamic Random Access Memories) include a cell array and a drive peripheral. Individual memory cells are disposed in the cell array.

A DRAM chip contains a matrix of memory cells that are disposed in the form of rows and columns and are driven by word lines and bit lines. Data is read from the memory cells, and is written to the memory cells, by activating suitable word lines and bit lines.

A memory cell of a DRAM normally contains a transistor connected to a capacitor. The transistor include, inter alia, two diffusion regions that are separated from one another by a channel that is controlled by a gate. Depending on the direction of the column flow, one diffusion region is referred to as the drain region, and the other diffusion region is referred to as the source region.

One of the diffusion regions is connected to a bit line, while the other diffusion region is connected to the capacitor, and the gate is connected to a word line. Applying suitable voltages to the gate controls the transistor such that a current flow through the channel between the diffusion regions is switched on and off.

The progress in the miniaturization of memory components has resulted in the continuous increase of integration density, meaning that the surface area available per memory cell is decreasing to an ever greater extent. To utilize the available surface area effectively, the selection transistor may be in the form of a vertical transistor in a trench above a trench capacitor. A memory cell having a trench capacitor and a vertical selection transistor is in the prior art, for example, in U.S. Pat. No. 5,744,386 to Kenney. U.S. Pat. No. 5,208,657 to Chatterjee also describes further embodiments of trench capacitors and transistors.

One disadvantage of the prior art memory cell in a semiconductor memory is that such cells require a cell surface area of at least $5F^2$, where F is the smallest length unit that can be imaged lithographically.

SUMMARY OF THE INVENTION

It is accordingly an object of the invention to provide a method for producing a memory cell for a semiconductor memory that overcomes the hereinafore-mentioned disadvantages of the heretofore-known devices and methods of this general type and that allows memory cells with a cell surface area of only $4F^2$.

With the foregoing and other objects in view, there is provided, in accordance with the invention, a method for producing at least two memory cells for a semiconductor memory, each of the memory cells having a vertical selection transistor and a capacitor, the transistor having first and second doped regions and a channel region, and the capacitor having first and second capacitor electrodes and a dielectric, including the steps of providing layers one above another on a substrate, the layers including a first insulation layer, a higher doped semiconductor layer, and a lower doped semiconductor layer, applying a grid-shaped etching mask, etching a trench structure into the semiconductor layers to form a web surrounded by the trench structure, the web having a side wall, an upper area, and a lower area each disposed in the trench structure, forming the capacitor dielectric by providing a dielectric layer on the side wall in the lower area of the web to surround the web, the higher doped layer forming the first capacitor electrode in the lower area of the web, the upper area of the web underneath the lower doped layer forming the first doped region of the transistor, filling the trench structure with a conductive trench filling to form the second capacitor electrode, the second capacitor electrode being a common capacitor electrode for adjacent ones of the memory cells, forming a second insulation layer on the conductive trench filling in the trench structure, forming a gate electrode of the transistor by providing side edge webs on the web in a region of the lower doped layer, and forming the channel region of the transistor with the lower doped layer, introducing dopant into the upper area of the web to form a doped layer, the doped layer being the second doped region of the transistor, forming a bit line on the web on the doped layer, forming a word line above the bit line, and forming a word line contact connecting the word line to the gate electrode.

The method according to the invention has the advantage that a substrate surface area of only $4F^2$ is required for each memory cell. A further advantage is that a considerably smaller number of processing steps are required to form the memory cell according to the invention as compared to the prior art.

The trench is etched using the pattern that is formed by two crossing line grids. As a result, individual, freestanding webs are formed, which form the inner capacitor electrode with the memory node in their lower area, and contain a vertical transistor in their upper area, on the substrate surface. Once the capacitor dielectric has been deposited and the trench has been filled with a conductive trench filling, this results in the cell plate being an opposing electrode in the form of a type of perforated plate, in whose holes the webs with the respective cell nodes and the vertical selection transistors are disposed. A further advantage is that no STI isolation (Shallow Trench Isolation) is required for the cell array. A further advantage is that the cell array does not require any additional isolation structure that, in conventional memory cells, leads to the individual memory cells requiring a greater amount of space. A further advantage is that a self-adjusting contact is produced to the cell node and to the vertical selection transistor. Such an advantage means that the web is structured in one etching step, which structures not only the inner capacitor electrode together with the memory node, but also the selection transistor. Another advantage is that there is no need for additional insulation for the selection transistor. Still another advantage is that there is no need for an insulation collar in the trench because the parasitic transistor, which is disposed on the trench outer wall in conventional memory cells, can be avoided by virtue of the advantageous geometric configuration.

In accordance with another mode of the invention, the substrate is in the form of a silicon-on-insulator substrate. A silicon-on-insulator substrate (SOI) has the advantage that, for example, the etching of the trench can stop on the insulation layer of the SOI substrate in a self-adjusting manner.

In accordance with a further mode of the invention, a gate oxide is formed above the insulation layer, on the side wall of the web. The gate oxide can be formed, for example, by thermal oxidation and, for example, insulates the gate electrode, which is formed subsequently, from the channel region.

In accordance with an added mode of the invention, a conformal layer is deposited with a layer thickness of between one sixth and one half of the width of the trench, and is etched back anisotropically, with the gate being formed from the conformal layer as a side edge web on the web. The gate is in this case in the form of a spacer and can, for example, be disposed all round the web, for example, on four sides of the web. The configuration has the advantage that the channel width of the vertical selection transistor is four times as great, and the memory cell can, thus, be charged and discharged very quickly.

In accordance with an additional mode of the invention, a barrier layer is formed between the doped layer and the bit line. The barrier layer is used, for example, to protect the doped layer against materials that are disposed in the bit line. This is expedient if metals are disposed in the bit line. The metals give the bit line low impedance.

In accordance with yet another mode of the invention, a further insulation layer is formed on the bit line, with a trench, in which the word line is formed, being formed in the further insulation layer.

The further insulation layer separates the bit line and the word line from one another, and the word line can be formed, for example, by a Damascene or dual-Damascene process.

In accordance with yet a further mode of the invention, a bit line insulation is formed alongside and on the bit line.

In accordance with yet an added mode of the invention, the bit line insulation is used as a self-adjusting etching mask for the etching of a contact hole for the word line contact. This has the advantage that the contact hole for making contact between the gate and the word line can be exposed and etched, adjusted roughly, with the bit line insulation resulting in the etching being forced forward in a self-adjusting manner with respect to the gate electrode.

In accordance with yet an additional mode of the invention, the substrate is a silicon-on-insulator substrate having an SOI insulation layer, the higher doped layer is of a first conductivity, the lower doped layer is of a second conductivity, and there is provided the steps of placing the higher doped layer on the SOI insulation layer, the higher doped layer forming the second capacitor electrode and the second doped region of the transistor and placing the lower doped layer on the higher doped layer, the lower doped layer forming the channel region of the transistor.

In accordance with again another mode of the invention, the higher doped semiconductor layer is between the first insulation layer and the lower doped semiconductor layer.

In accordance with again a further mode of the invention, the first insulation layer is closer to the substrate than the higher doped semiconductor layer and the lower doped semiconductor layer.

In accordance with a concomitant mode of the invention, the first insulation layer is adjacent the substrate.

Other features that are considered as characteristic for the invention are set forth in the appended claims.

Although the invention is illustrated and described herein as embodied in a method for producing a memory cell for a semiconductor memory, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIGS. 2 to 7 are cross-sectional views along section line A—A of FIG. 1 of sequential steps in a production method for forming a memory cell according to the invention.

DESCRIPTION OF THE PREFERRED EMBODIMENTS

Figure 1:
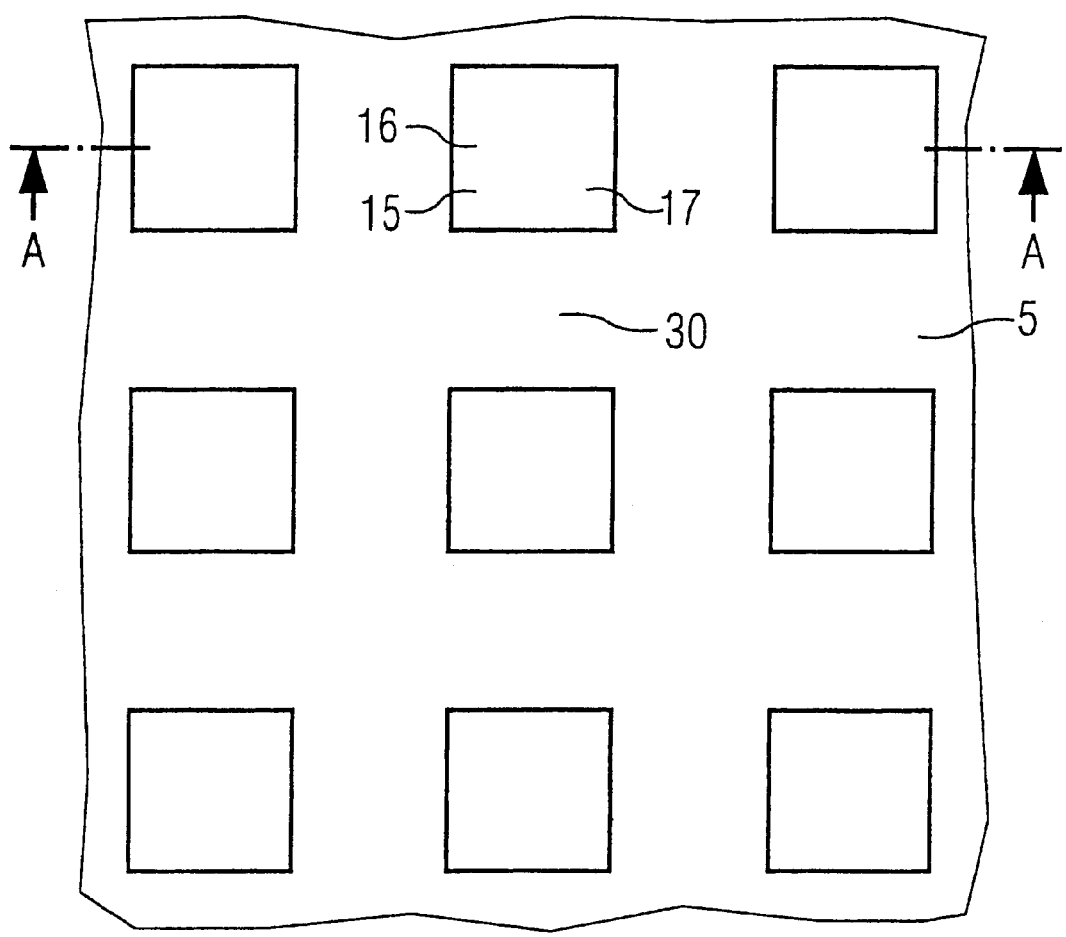
FIG. 1 is a fragmentary plan view of a cell array with a freestanding web surrounded by a trench according to the invention.

Referring now to the figures of the drawings in detail and first, particularly to FIG. 1 thereof, there is shown a substrate 5 on which a freestanding web 17 is disposed, which is surrounded by a trench 30. The freestanding web 17 includes a first doped layer 15, in which a memory node is disposed as an inner capacitor electrode 16.

Figure 2:
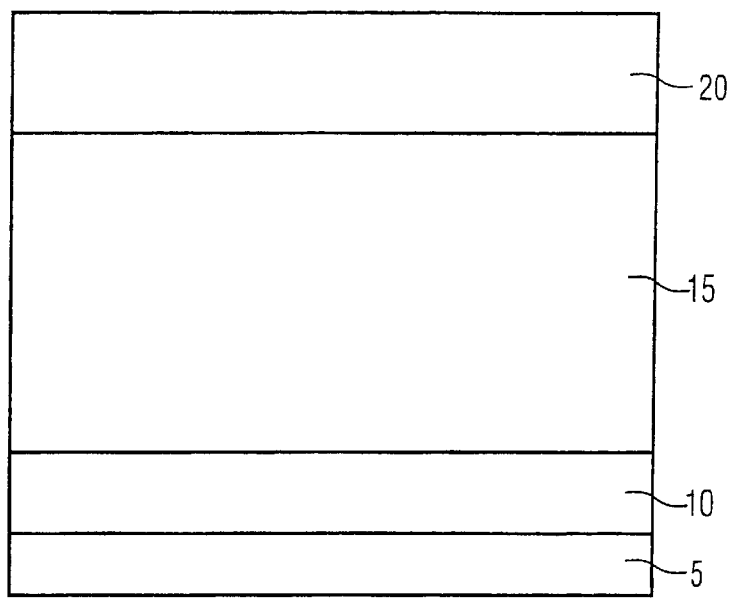

FIG. 2 is a cross-section along the section line A—A through the substrate 5 illustrated in FIG. 1. The substrate 5 is an SOI substrate (Silicon On Isolator), with a first insulation layer 10 being disposed on the substrate 5, on which first insulation layer 10 a first doped layer 15 is disposed, and on which a second, undoped layer 20 is disposed. The substrate 5 is, for example, a silicon substrate. The first doped layer 15 is formed, for example, from highly doped silicon, and the undoped layer has a dopant concentration of less than $10^{16}$ dopant atoms per cubic centimeter.

Figure 3:
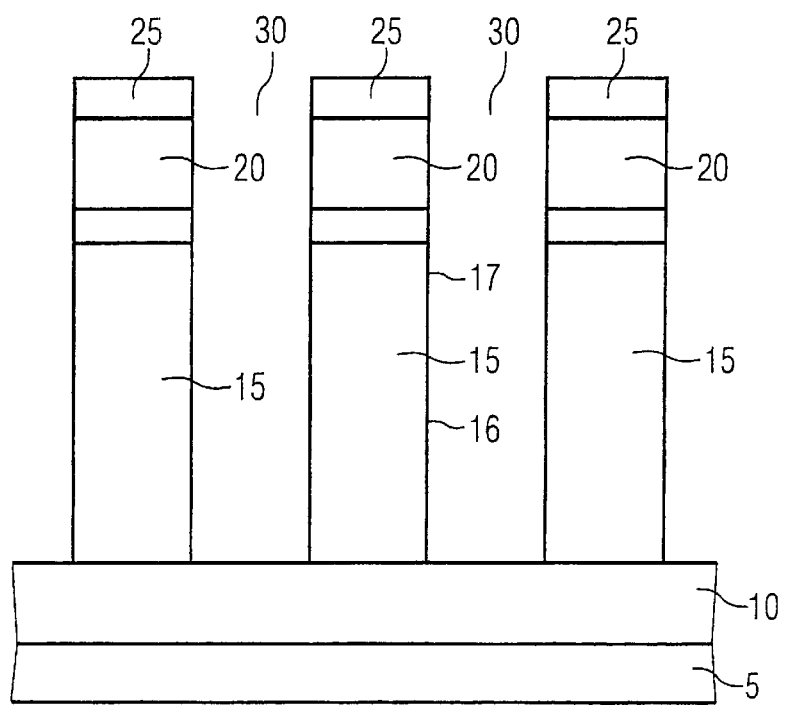

With reference to FIG. 3, a mask layer 25 is deposited on the undoped layer 20. A hard mask composed of a doped silicate glass such as boron or phosphorus silicate glass, is then formed on the mask layer 25. A photoresist is then deposited on the hard mask and is exposed in one or else two photographic steps—for example, with two crossing line grids—and is then developed. Thereafter, the hard mask is etched, with the resist mask being used as an etching mask. The resist mask is then removed from the hard mask. The mask 25, the undoped layer 20, and the first doped layer 15 are then etched, with the hard mask being used as an etching mask. By way of example, the first insulation layer 10 can in this case be used as an etching stop for the etching process. During the etching process, a trench 30 is produced that surrounds a freestanding web 17. The freestanding web 17 has the first doped layer 15 in its lower area and has the undoped layer 20 in its upper area. The hard mask is then removed from the mask 25.

With reference to FIG. 4, a dielectric layer 35 is formed in the lower area of the trench 30, for example, by thermal oxidation or thermal nitriding as well as CVD (Chemical Vapor Deposition) deposition. The dielectric layer 35 is formed, for example, from silicon nitride, silicon oxide, or silicon oxinitride. The trench 30 is then filled with a conductive trench filling 40 and covers the dielectric layer 35, performed, for example, by depositing a polycrystalline silicon layer that is highly n-doped. If conformal deposition is used, then the conductive trench filling is likewise formed on the mask 25, so that the conductive trench filling 40 is recessed into the trench 30 in a subsequent etching-back step. An oxide layer 45 is then deposited in the trench 30. In this case as well, the oxide layer is deposited conformally, so that it is likewise disposed on the mask 25. The second insulation layer 45 is then recessed into the trench 30. That part of the web 17 that is disposed above the second insulation layer 45 has the dielectric layer 35 removed from it, so that the side wall of the web 17 is exposed in the area above the second insulation layer 45.

With reference to FIG. 5, a gate oxide 50 is formed with a thickness of approximately 5 nanometers by a temperature step. The gate 55 is then deposited conformally, with the gate 55 is being formed from an n-doped polysilicon. In such a case, the gate 55 is formed with a thickness of approximately one third of the width of the trench 30. Anisotropic etching is then carried out, with the gate 55 being formed as a side edge web on the gate oxide 50 on the side wall of the web 17. The spacer etching to form the gate 55 is in this case carried out such that a portion of the undoped layer 20 is disposed above the gate 55. A third insulation layer 60 is then deposited into the trench 30, and is planarized by a Chemical Mechanical Polishing (CMP) step.

Figure 6:
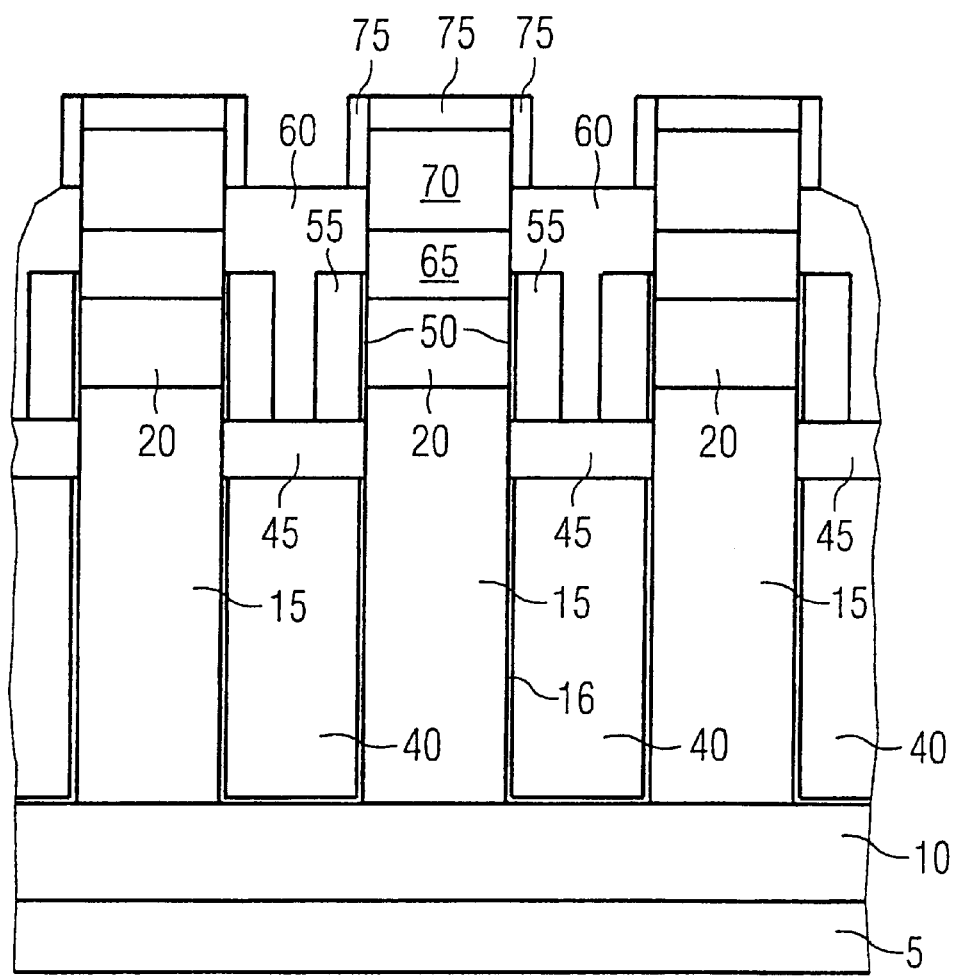

With reference to FIG. 6, the mask 25 is removed from the web 17. The upper area of the web 17 is then doped, for example, by implantation. n+ and p+ dopants using arsenic, phosphorous or boron are suitable for use as the doping material. A second doped layer 65 is formed in the web 17 in the process. A barrier is optionally deposited onto the second doped layer 65.

A conductive layer is then deposited onto the barrier, and a bit line 70 is structured therefrom. The conductive layer of the bit line 70 is formed, for example, from tungsten silicide. Bit line insulation 75 is then deposited on the conductive layer. A resist mask is deposited onto the bit line insulation 75, is structured by a photographic technique, and is then developed. The bit line insulation 75 and the conductive layer 70 are then structured, with the bit line 70 being formed on the second doped layer 65. An insulation layer is then deposited conformally, from which the bit line insulation 75 is structured by a spacer technique. The bit line insulation 75 is formed, for example, from silicon nitride.

Figure 7:
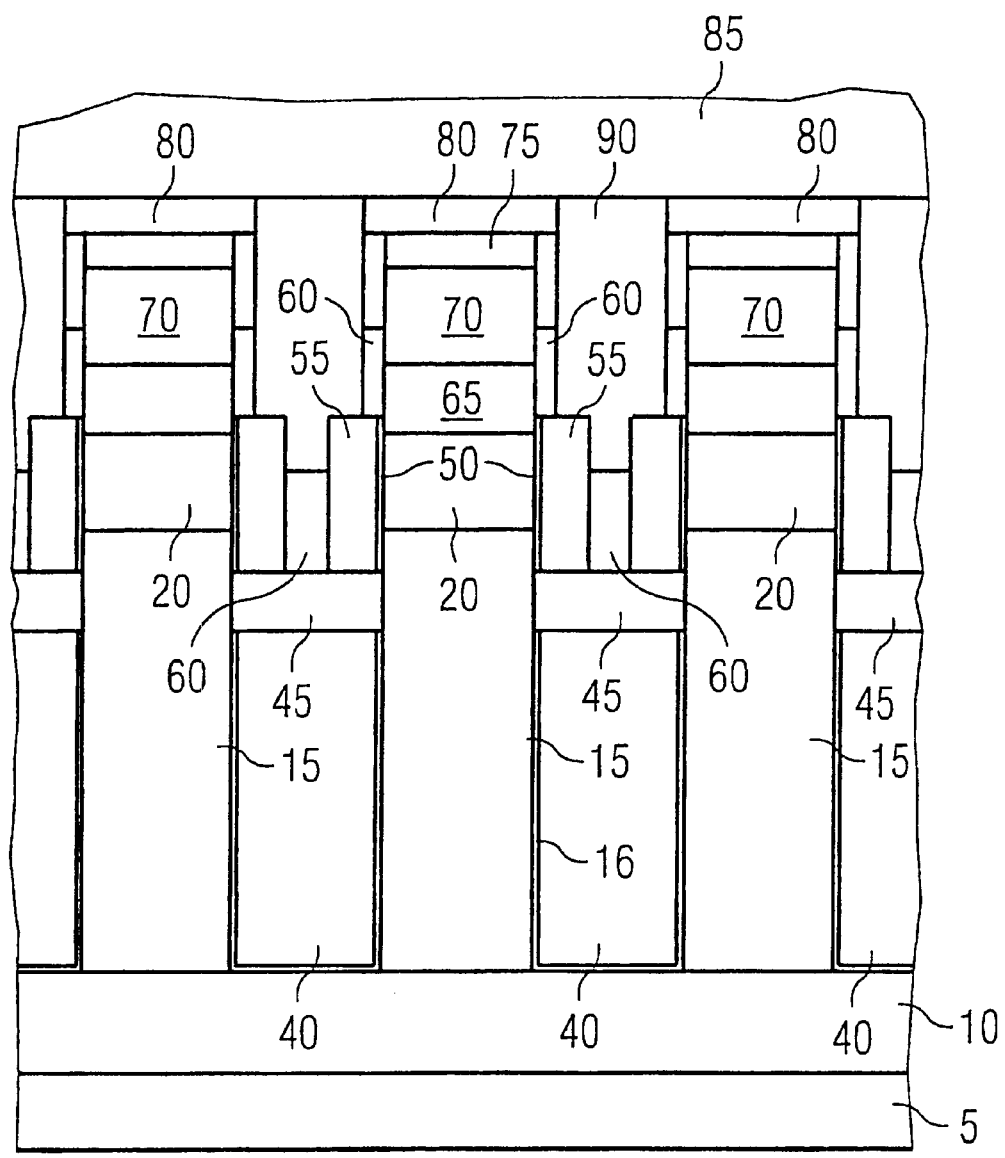

With reference to FIG. 7, a fourth insulation layer 80 is deposited. The fourth insulation layer 80 is composed, for example, of silicon oxide. The fourth insulation layer 80 is then planarized by a CMP step. Trenches, in which a word line 85 can then be disposed, are etched by a structured resist mask in the fourth insulation layer 80. Contact holes, in which a word line contact 90 can then be formed, are etched by a second resist mask in the fourth insulation layer 80 and in the third insulation layer 60. After the etching of the word line trench and of the contact hole for the word line contact, a barrier layer is additionally optionally deposited. The word line contact 90 and the word line 85 are then deposited. The word line 85 and the word line contact 90 are formed, for example, from tungsten. A CMP step is then carried out, to planarize the tungsten layer. The technique for forming the word line 85 and the word line contact 90 is conventional, for example, as a Damascene or dual-Damascene technique.

We claim:

1. A method for producing at least two memory cells for a semiconductor memory, each of the memory cells having a vertical selection transistor and a capacitor, the transistor having first and second doped regions and a channel region, and the capacitor having first and second capacitor electrodes and a dielectric, which comprises:
   providing layers one above another on a substrate, the layers including a first insulation layer, a higher doped semiconductor layer, and a lower doped semiconductor layer;
   applying a grid-shaped etching mask;
   etching a trench structure into the semiconductor layers to form a web surrounded by the trench structure, the web having a side wall, an upper area, and a lower area each disposed in the trench structure;
   forming the capacitor dielectric by providing a dielectric layer on the side wall in the lower area of the web to surround the web, the higher doped layer forming the first capacitor electrode in the lower area of the web, the upper area of the web underneath the lower doped layer forming the first doped region of the transistor;
   filling the trench structure with a conductive trench filling to form the second capacitor electrode, the second capacitor electrode being a common capacitor electrode for adjacent ones of the memory cells;
   forming a second insulation layer on the conductive trench filling in the trench structure;
   forming a gate electrode of the transistor by providing side edge webs on the web in a region of the lower doped layer, and forming the channel region of the transistor with the lower doped layer;
   introducing dopant into the upper area of the web to form a doped layer, the doped layer being the second doped region of the transistor;
   forming a bit line on the web on the doped layer;
   forming a word line above the bit line; and
   forming a word line contact connecting the word line to the gate electrode.

2. The method according to claim 1, which further comprises forming a gate oxide above the second insulation layer on the side wall of the web.

3. The method according to claim 1, which further comprises depositing a conformal layer having a layer thickness of between one sixth and one half of a width of the trench structure and anisotropically etching back to form the gate electrode from the conformal layer as a side edge web on the web.

4. The method according to claim 1, which further comprises forming a barrier layer between the doped layer and the bit line.

5. The method according to claim 1, which further comprises:
   forming a third insulation layer on the bit line;
   forming a trench in the third insulation layer; and
   forming the word line in the trench.

6. The method according to claim 1, which further comprises forming bit line insulation alongside and on the bit line.

7. The method according to claim 6, which further comprises utilizing the bit line insulation as a self-adjusting etching mask for etching a contact hole for the word line contact.

8. The method according to claim 1, wherein:
   the substrate is a silicon-on-insulator substrate having an SOI insulation layer;
   the higher doped layer is of a first conductivity;
   the lower doped layer is of a second conductivity; and
   which further comprises:
      placing the higher doped layer on the SOI insulation layer, the higher doped layer forming the second capacitor electrode and the second doped region of the transistor; and
      placing the lower doped layer on the higher doped layer, the lower doped layer forming the channel region of the transistor.

9. The method according to claim 1, wherein the higher doped semiconductor layer is between the first insulation layer and the lower doped semiconductor layer.

10. The method according to claim 9, wherein the first insulation layer is closer to the substrate than the higher doped semiconductor layer and the lower doped semiconductor layer.

11. The method according to claim 9, wherein the first insulation layer is adjacent the substrate.

* * * * *